(12) United States Patent
Seshan

(10) Patent No.: US 6,937,458 B2
(45) Date of Patent: Aug. 30, 2005

(54) SELECTABLE DECOUPLING CAPACITORS FOR INTEGRATED CIRCUIT AND METHODS OF USE

(75) Inventor: Krishna Seshan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/726,050

(22) Filed: Dec. 2, 2003

(65) Prior Publication Data

US 2004/0108596 A1 Jun. 10, 2004

Related U.S. Application Data

(62) Division of application No. 09/792,596, filed on Feb. 23, 2001, now Pat. No. 6,686,659.

(51) Int. Cl.[7] .............................................. H01G 4/10
(52) U.S. Cl. ................. 361/303; 361/306.1; 361/321.3; 257/532; 257/698; 257/737
(58) Field of Search .............................. 257/532, 698, 257/737; 361/303, 306.1, 321.3

(56) References Cited

U.S. PATENT DOCUMENTS

| | | | |
|---|---|---|---|
| 4,273,859 A | | 6/1981 | Mones et al. ............... 430/315 |
| 4,439,813 A | * | 3/1984 | Dougherty et al. ....... 361/321.3 |
| 4,945,399 A | * | 7/1990 | Brown et al. ............... 257/698 |
| 5,404,265 A | * | 4/1995 | Moresco et al. .......... 361/306.1 |
| 5,808,853 A | | 9/1998 | Dalal et al. ............... 361/306.1 |
| 6,094,090 A | | 7/2000 | Yamauchi ................... 327/537 |
| 6,175,345 B1 | | 1/2001 | Kuribayashi et al. ......... 345/76 |
| 6,222,246 B1 | | 4/2001 | Mak et al. .................. 257/532 |
| 6,243,311 B1 | | 6/2001 | Keeth ......................... 365/206 |
| 6,255,899 B1 | * | 7/2001 | Bertin et al. ................ 327/564 |
| 6,335,568 B1 | | 1/2002 | Yuzawa et al. ............. 257/738 |

FOREIGN PATENT DOCUMENTS

JP 62-265732 11/1987 ........... H01L/21/60

* cited by examiner

*Primary Examiner*—David Nelms
*Assistant Examiner*—Dao H. Nguyen
(74) *Attorney, Agent, or Firm*—Schwegman, Lundberg, Woessner & Kluth, P.A.

(57) ABSTRACT

Selectable capacitors are used to modify performance characteristics of functional circuit elements of an integrated circuit (IC). In one embodiment, the decoupling capacitors are implemented as additional or alternative mounting pads on a surface of the IC. At least one selectable capacitor is provided for each IC circuit element, such as a logic network, whose operational characteristic(s) is predicted to be and is actually identified as sub-optimal through IC testing, particularly following a process change, a mask shrink, operation of the IC at higher clock frequency, or the like. Expensive redesign is avoided by selectively coupling capacitors into the IC circuit element as needed, under control of selector logic that is responsive to control signals. Methods of operation, as well as application of the apparatus to an electronic assembly and an electronic system, are also described.

17 Claims, 12 Drawing Sheets

SELECTABLE DECOUPLING CAPACITORS FOR INTEGRATED CIRCUIT AND METHODS OF USE

DIVISIONAL APPLICATION

The present application is a divisional of application U.S. Ser. No. 09/792,596, filed on Feb. 23, 2001, now issued as U.S. Pat. No. 6,686,659, which is incorporated herein by reference.

TECHNICAL FIELD

Embodiments of the inventive subject matter relate generally to the field of semiconductors and, more particularly, to improved apparatus and methods for designing, fabricating, testing, and correcting integrated circuits.

BACKGROUND INFORMATION

Integrated circuits (ICs) are typically assembled into packages by physically and electrically coupling them to a substrate. One or more IC packages can be physically and electrically coupled to a printed circuit board (PCB) to form an "electronic assembly". An "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones including Internet cellular phones, cordless phones, pagers, etc.), computer-related peripherals (e.g., printers, scanners, monitors, etc.), entertainment devices (e.g., televisions, radios, stereos, tape and compact disc players, video cassette recorders, digital video disk (DVD) equipment, MP3 (Motion Picture Experts Group, Audio Layer 3) players, etc.), and the like.

Integrated circuits (ICs) typically contain one or more functional circuit elements, such as data buffers, latching circuits, adder circuits, flip-flops, logic gates, driver circuits, decoder circuits, inverter circuits, counting circuits, registers, multiplexing circuits, amplifier circuits, sensing circuits, radio frequency circuits, and many other types of circuits. Power is supplied to the circuit elements of an IC through suitable power and ground connections, such as IC terminals or other types of connectors. Input signals are supplied to, and output signals are obtained from, the circuit elements of an IC through suitable input/output (I/O) connections, which can also be implemented in the form of IC terminals or other types of connectors.

In the field of electronic systems there is an incessant competitive pressure among manufacturers to drive the performance of their equipment up while driving down production costs. This is particularly true regarding the design, fabrication, and testing of ICs. ICs must generally be tested before they are incorporated into an electronic assembly in order to verify that each circuit element on the IC functions properly. During the life cycle of an IC, various factors, either singly or in combination, can contribute to faulty operation. For example, sub-optimal operation or even total failure can result from many factors, such as a change in the process used to fabricate the IC, shrinking the masks used to fabricate the IC to produce more chips per silicon wafer in order to reduce production costs, operation of the IC at a higher clock frequency in an attempt to improve performance, and so forth.

As a result of changes in production or operation, including the examples mentioned above, one or more circuit elements can display functional problems or failures when the IC is tested. Such problems or failures sometimes include sub-optimal performance issues referred to in the art as "escapes" or "speedpaths". An "escape" refers to an imbalance in a resistive-capacitive (RC) characteristic of a circuit that results in sub-optimal performance, for example, when the circuit is operated within a particular frequency range. A "speedpath" refers to sub-optimal performance when timing issues occur over a critical path within a group of connected logic circuits. Escapes and speedpaths can often be resolved by adjusting the RC characteristic of the associated circuit(s).

In the prior art, when one or more circuit elements of an IC develops a functional problem, the only known solution is to redesign the relevant portion or portions of the IC or IC package, so that the problem is avoided. IC redesign generally necessitates the generation of a new set of masks at a very substantial cost, and it additionally incurs time delays that can jeopardize an IC producer's competitive position in the market.

For the reasons stated above, and for other reasons stated below which will become apparent to those skilled in the art upon reading and understanding the present specification, there is a significant need in the art for IC circuit elements that can readily be corrected, without redesign, in the event their operation is tested to be sub-optimal, as well as for methods of designing, fabricating, and testing such ICs.

DETAILED DESCRIPTION

Figure 1:
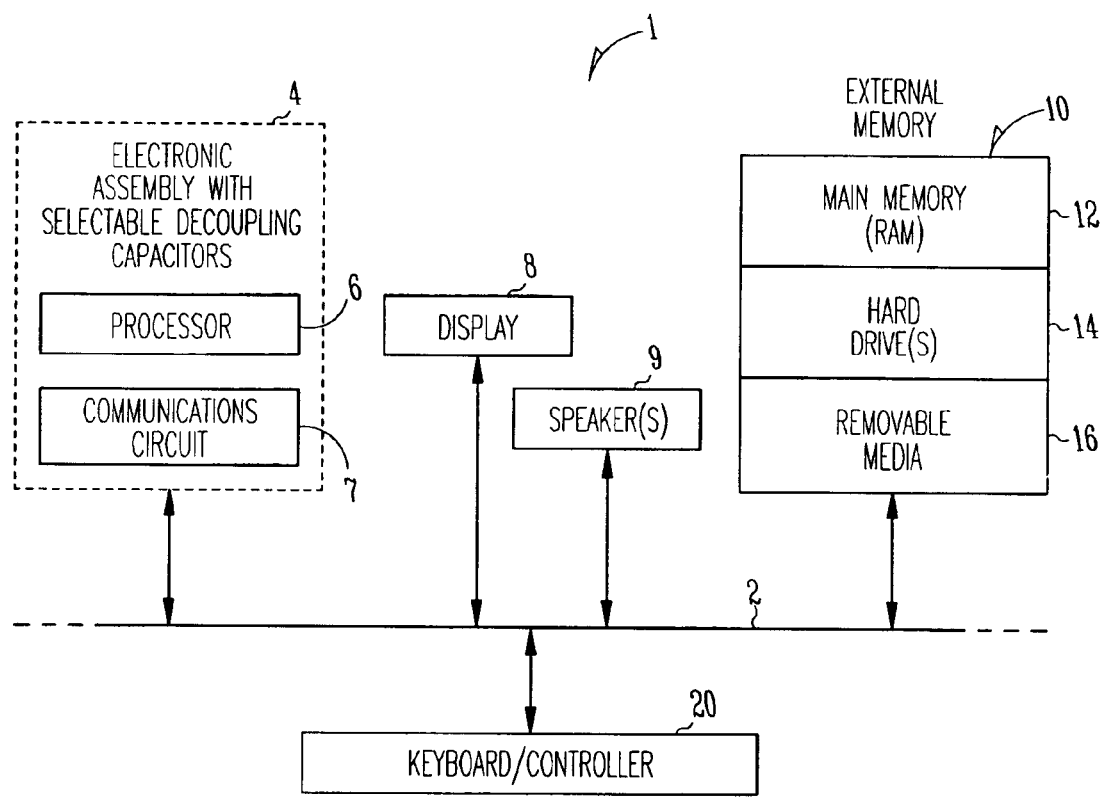
FIG. 1 is a block diagram of an electronic system incorporating at least one electronic assembly with selectable decoupling capacitors, according to one embodiment of the invention.

In the following detailed description of embodiments of the invention, reference is made to the accompanying drawings which form a part hereof, and in which is shown by way of illustration specific preferred embodiments in which the teachings of the disclosure may be practiced. These embodiments are described in sufficient detail to enable those skilled in the art to practice them, and it is to be understood that other embodiments may be utilized and that logical, physical, electrical, and process changes may be made without departing from the spirit and scope of the present disclosure. Such embodiments of the inventive subject matter may be referred to, individually and/or collectively, herein by the term "invention" merely for convenience and without intending to voluntarily limit the scope of this application to any single invention or inventive concept if more than one is in fact disclosed. The following detailed description is, therefore, not to be taken in a limiting sense, and the scope of embodiments of the present invention is defined only by the appended claims.

Embodiments of the present invention provide a solution to the prior art problem of having to carry out a costly and time-consuming mask change when the operation of one or more circuit elements of an IC proves defective or sub-optimal following test. Various embodiments are illustrated and described herein. In one embodiment, selectable capacitors are incorporated into an IC as additional or alternative mounting terminals on a surface of the IC, particularly for circuit elements whose operational characteristic(s) is predicted as possibly being sub-optimal under normal operation, or as possibly becoming sub-optimal as a result of a process change, design change, mask shrink, operation of the IC at higher clock frequency or under other conditions that deviate from original specifications, or the like.

Expensive redesign of the IC is avoided by selectively coupling capacitors into the IC circuit element as needed, under control of selector logic that is responsive to suitable control inputs. The selector logic includes one or more coupling elements that can switchably couple any combination of existing IC mounting terminals and additional IC capacitive terminals to a node of the circuit element to change the operational characteristic(s) of the circuit element so that it functions within desired parameters. For example, for a circuit element having $V_{SS}$ and $V_{DD}$ terminals, each of which has an additional floating terminal comprising a decoupling capacitor, four combinations of terminals can be used to couple $V_{SS}$ and $V_{DD}$ to the circuit element, as will be described in greater detail below. The particular logic combination selected depends upon whether a particular operational characteristic(s) of the circuit element needs to be modified, as determined by the outcome of testing the IC following fabrication.

To the extent that particular ones of the additional mounting terminals of the IC are switched in, the IC package substrate is provided with corresponding mounting pads and circuit paths to connect with the additional mounting terminals of the IC.

A method of testing and correcting an IC, a method of designing, fabricating, and packaging an IC, as well as application of the apparatus to an electronic assembly, to an electronic system, and to a data processing system, are also described.

FIG. 1 is a block diagram of an electronic system 1 incorporating at least one electronic assembly 4 with selectable decoupling capacitors, according to one embodiment of the invention. Electronic system 1 is merely one example of an electronic system in which embodiments of the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits, including one or more ICs (not shown). In one embodiment, electronic assembly 4 includes a processor 6 which can be of any type. As used herein, "processor" means any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), an artificial intelligence circuit, neural network, or any other type of circuit for performing processing functions of any type, or a combination of such computational circuits.

Other types of circuits that can be included in electronic assembly 4 are a logic circuit, memory circuit, sensing circuit, transducer circuit, power circuit, amplifying circuit, data conversion circuit, data transmission circuit, data receiving circuit, control circuit, custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. Any of the foregoing types of circuits, or any other type(s) of circuits, can be implemented as one or more ICs in electronic assembly 4.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, one or more speakers 9, and a keyboard and/or controller 20, which can include a mouse, trackball, game controller, voice-recognition device, or any other device that permits a system user to input information into and receive information from the electronic system 1.

Figure 2:
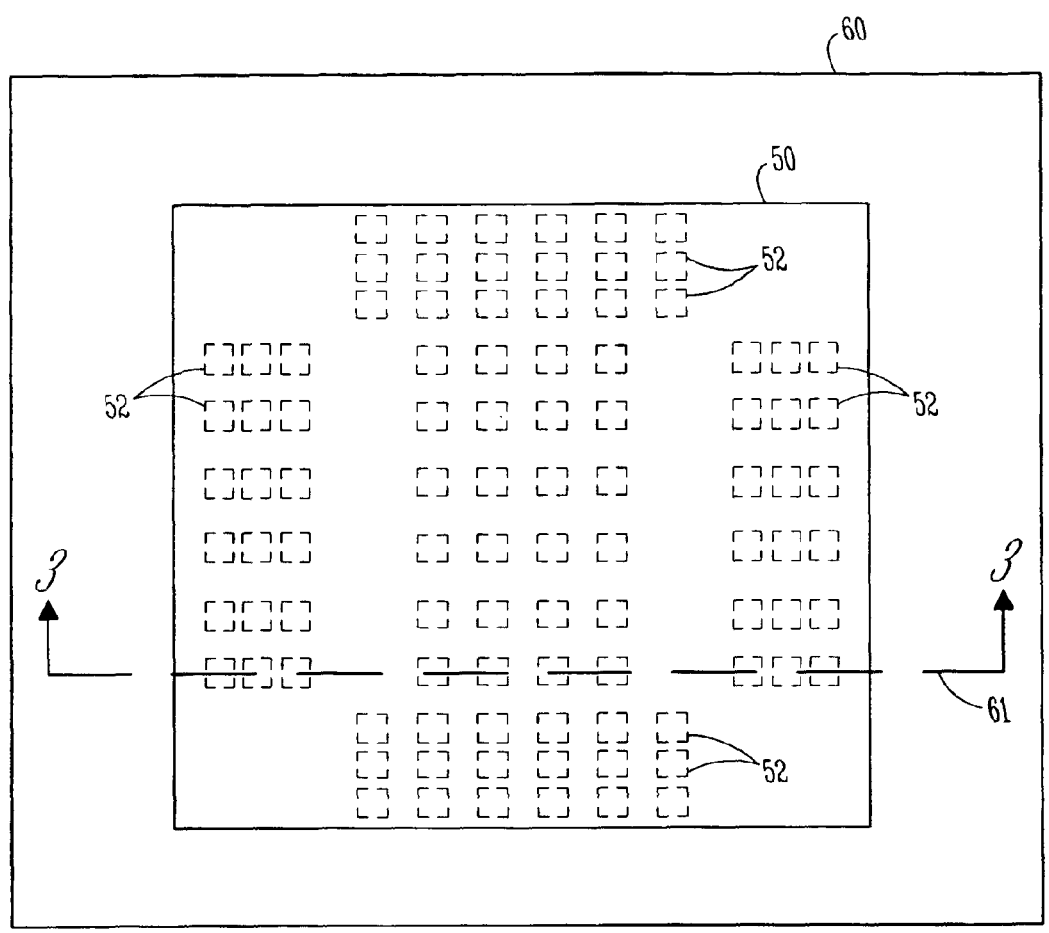
FIG. 2 illustrates a top-view of an IC on a substrate in a prior art electronic package.

FIG. 2 illustrates a top-view of an IC 50 on a substrate 60 in a prior art electronic package. In FIG. 2, IC 50 comprises a plurality of power, ground, and signal conductors (not shown) that terminate in terminals 52 arranged on the bottom surface of IC 50. Terminals 52 can be coupled to corresponding pads or signal nodes (not shown) on substrate 60 by appropriate connections such as solder bumps or solder balls (56, FIG. 3).

In FIG. 2 we are looking through the upper surface of IC 50 at terminals 52 (shown in dashed lines) on the bottom surface of IC 50. Individual terminals 52 represent power, ground, or signal nodes. As used herein, the term "ground node" refers to a node at ground potential (e.g. $V_{SS}$), and the term "power node" refers to a node at a potential different from ground (e.g. $V_{DD}$). It will be observed that there is room available on IC 50 for additional terminals, and in FIG. 10 below it will be shown how this available space can be utilized in implementing an embodiment of the present invention.

Figure 3:
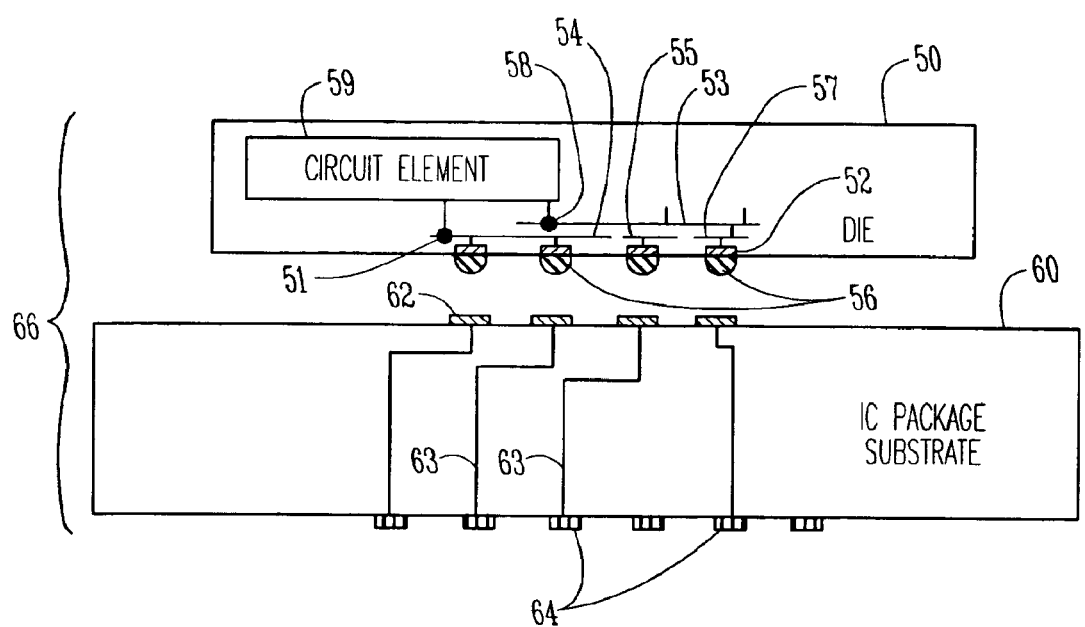
FIG. 3 illustrates a cross-sectional view of the prior art electronics package shown in FIG. 2 taken along line 61 of FIG. 2.

FIG. 3 illustrates a cross-sectional view of the prior art IC 50 and substrate 60 shown in FIG. 2 taken along line 61 of FIG. 2. Together, IC 50 and substrate 60 constitute an IC package 66. Coupled to each terminal 52 is a corresponding solder bump or solder ball 56.

IC 50 further comprises a plurality of internal traces 53–55 and 57 that are coupled to various ones of terminals 52. Internal traces 53–55 and 57 couple terminals 52 to various circuit nodes within IC 50. For example, trace 54 couples two terminals 52 to a node 51. Node 51 in turn is coupled to a circuit element 59. Another trace 53 couples a terminal 52 to a node 58, which is also coupled to circuit element 59.

Although only one circuit element 59 is illustrated, IC 50 can have many circuit elements 59. Circuit element 59 can be of any type, such as, for example, a digital logic circuit, an analog circuit, a power circuit, sense circuit, amplifier circuit, radio circuit, or the like.

Also illustrated in FIG. 3 is an IC package substrate 60, to which IC 50 can be coupled. Substrate 60 comprises a plurality of pads 62 on its upper surface. Pads 62 are coupled to various internal circuit traces or circuit paths 63. Circuit paths 63 are in turn coupled to various connector terminals or lands 64 on the bottom surface of substrate 60.

Figure 4:
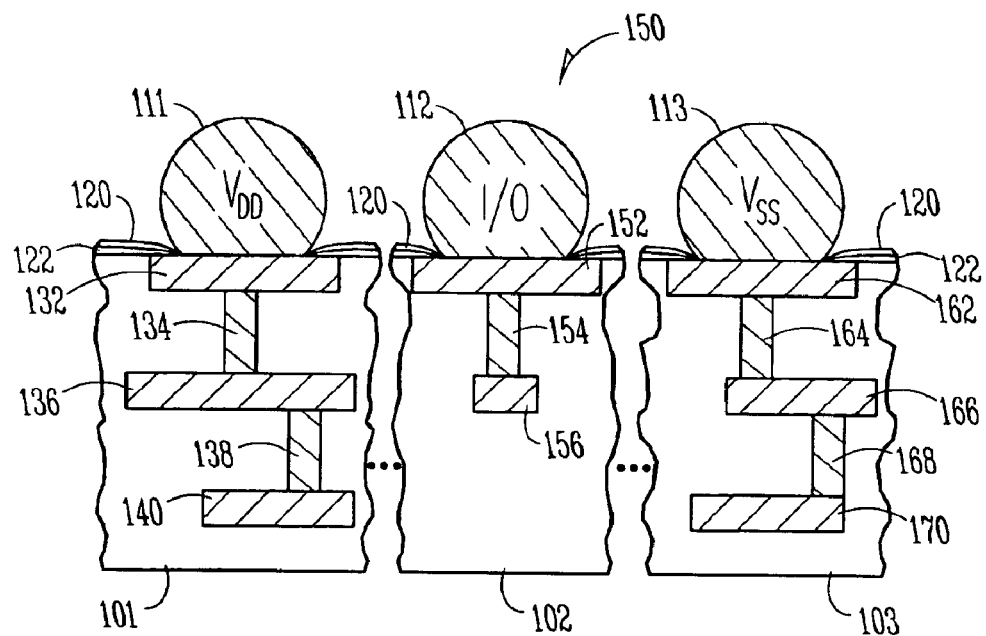
FIG. 4 illustrates a physical representation of three portions of a prior art IC, having representative power, I/O, and ground bumps.

FIG. 4 illustrates a physical representation of three portions 101–103 of a prior art IC 150, having representative power, I/O, and ground bumps 111, 112, and 113, respectively. IC 150 can be similar to IC 50 shown in FIGS. 2 and 3; however, it will be observed that IC 150 is shown inverted from IC 50 depicted in FIG. 3, because its solder bumps are facing up rather than down.

In the left-hand portion 101, bump 111 is to couple to $V_{DD}$; in the center portion 102, bump 112 is to couple to an input and/or output signal; and in the right-hand portion 103, bump 113 is to couple to $V_{SS}$. For illustrative purposes, each portion of IC 150 shown in FIG. 4 represents only a segment of an actual IC; however, it will be understood by those of ordinary skill in the art that each portion can comprise many more power, I/O, and/or ground bumps.

$V_{DD}$ bump 111 is coupled to a terminal 132, which forms part of a first metal layer. Terminal 132 in turn is illustrated as coupled to a first via 134, which in turn is coupled to an internal trace 136 that forms part of a second metal layer. Trace 136 is coupled to a second via 138, which is coupled to an internal trace 140 that forms part of a third metal layer.

I/O bump 112 is coupled to a terminal 152, which forms part of a first metal layer. Terminal 152 in turn is illustrated as coupled to a first via 154, which in turn is coupled to an internal trace 156 that forms part of a second metal layer.

$V_{SS}$ bump 113 is coupled to a terminal 162, which forms part of a first metal layer. Terminal 162 in turn is illustrated as coupled to a first via 164, which in turn is coupled to an internal trace 166 that forms part of a second metal layer. Trace 166 is coupled to a second via 168, which is coupled to an internal trace 170 that forms part of a third metal layer.

In all three portions 101–103 of IC 150, a polyimide layer 120 overlies a silicon nitride layer 122. The layers 120 and 122 of polyimide and silicon nitride, respectively, have been etched in the vicinity of bumps 111–113, so that bumps 111–113 make physical and electrical contact with corresponding terminals 132, 152, and 162.

Figure 5:
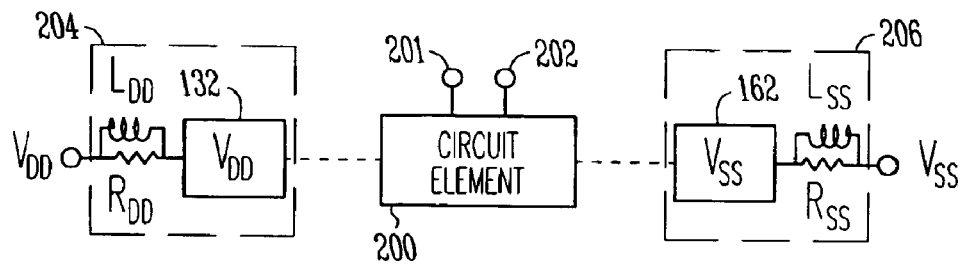
FIG. 5 illustrates an electrical representation of three portions of the prior art IC shown in FIG. 4, having representative power, I/O, and ground terminals.

FIG. 5 illustrates an electrical representation of three portions of the prior art IC 150 shown in FIG. 4, having representative power, I/O, and ground terminals.

A power ($V_{DD}$) terminal 132 on the left-hand side of FIG. 5 corresponds to $V_{DD}$ bump 111 in FIG. 4. When operated at a high alternating current (AC) frequency, $V_{DD}$ bump 111 in FIG. 4 functions as an equivalent resistive-inductive circuit, represented within dashed lines in FIG. 5 as circuit 204. Under this condition, circuit 204 comprises an equivalent inductor $L_{DD}$ and resistor $R_{DD}$ coupled in parallel to $V_{DD}$.

Similarly, a ground ($V_{SS}$) terminal 162 on the right-hand side of FIG. 5 corresponds to $V_{SS}$ bump 113 in FIG. 4. When operated at a high AC frequency, $V_{SS}$ bump 113 in FIG. 4 functions as an equivalent resistive-inductive circuit, represented within dashed lines in FIG. 5 as circuit 206. Under this condition, circuit 206 comprises an equivalent inductor $L_{SS}$ and resistor $R_{SS}$ coupled in parallel to $V_{SS}$.

Circuit element 200 in the center portion of FIG. 5 is a block diagram electrical representation of the center portion 102 of FIG. 4. Circuit element 200 can comprise one or more input and/or output nodes or terminals, such as I/O terminals 201 and 202.

Figure 6:
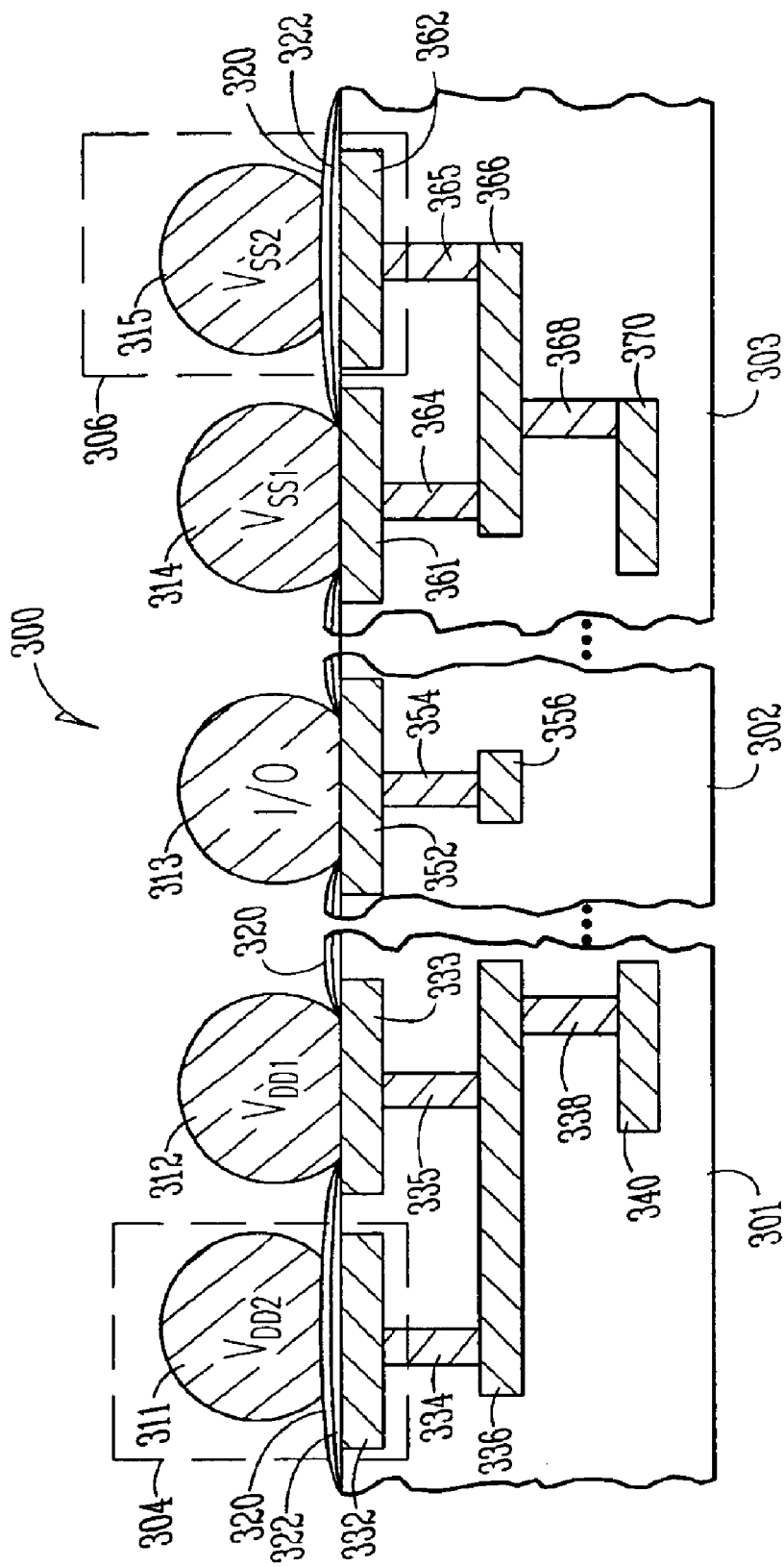
FIG. 6 illustrates a physical representation of three portions of an IC, having respective power, I/O, and ground bumps, and further having selectable decoupling capacitors, according to one embodiment of the invention.

FIG. 6 illustrates a physical representation of three portions 301–303 of an IC 300, having representative power, I/O, and ground bumps, 312, 313, and 314, respectively. IC 300 also has selectable decoupling capacitors 304 and 306, according to one embodiment of the invention.

Portion 301 can be similar to portion 101 of FIG. 4 regarding the physical structure of bump 312, terminal 333, first via 335, internal trace 336, second via 338, and internal trace 340. As in the prior art IC 150 shown in FIG. 4, bump 312 functions as a resistive-inductive bump. A resistive-inductive bump is referred to herein as a "non-floating terminal". As will be discussed further below, bump 312 can be selectively coupled to a node of portion 302, or it can be selectively not coupled to any node. Portion 302 represents a segment of a circuit element of the IC 300. A "circuit element" is defined herein to mean any type of electronic circuit or any portion thereof at any organizational or hierarchical level.

Portion 301 further comprises a decoupling capacitor 304. Decoupling capacitor 304 is also referred to herein as a "capacitive bump" or a "floating terminal". Decoupling capacitor 304 comprises a connector element in the form of solder bump 311 that can be selectively coupled to $V_{DD}$, or it can be selectively not coupled to $V_{DD}$. Bump 311 is physically and electrically separated from electrically conductive terminal 332 by one or more dielectric layers. In one embodiment, a first dielectric layer 322 is in contact with terminal 332. A second dielectric layer 320 is between dielectric layer 322 and bump 311. In one embodiment, dielectric layer 320 comprises polyimide, and dielectric layer 322 comprises silicon nitride. However, in other embodiments, other known dielectric materials can be substituted for silicon nitride and/or polyimide, or a different number of dielectric layers can be used. Conductive terminal 332 is coupled to a via 334, which in turn is coupled to internal conductor or trace 336.

Decoupling capacitor 304 comprises a capacitive element or structure that is formed by a pair of conductors (e.g. bump 311 and terminal 332) separated by one or more dielectric layers (e.g. layers 320 and 322). In one embodiment, a decoupling capacitor 304 thus constructed has a capacitive value of approximately 1 femto-Farad/square micron.

In the center portion 302 of IC 300, bump 313 is to couple to an input and/or output signal. In one embodiment, the I/O signals are bi-directional; in another embodiment, I/O signals are unidirectional. Bump 313 is coupled to terminal 352, which in turn is coupled to trace 356 by way of via 354.

The structure of the right-hand portion 303 of IC 300 can be similar to that of the left-hand portion 301. Bump 314 is coupled to terminal 361, which forms part of a first metal layer. Terminal 361 is coupled to a first via 364 that is coupled to an internal trace 366 that forms part of a second metal layer. Trace 366 is coupled to a second via 368, which is coupled to an internal trace 370 that forms part of a third metal layer. Bump 314 can be selectively coupled to a node of portion 302, or it can be selectively not coupled to any node.

Portion 303 further comprises a decoupling capacitor 306. Decoupling capacitor 306 comprises a solder bump 315 that can be selectively coupled to $V_{SS}$, or it can be selectively not coupled to $V_{SS}$. Similar to bump 311 in portion 301, bump 315 is physically and electrically separated from electrically conductive terminal 362 by one or more dielectric layers, such as polyimide layer 320 and silicon nitride layer 322. Conductive terminal 362 is coupled to a via 365, which in turn is coupled to internal trace 366.

In the left-hand portion 301, bumps 311 and 312 can be selectively coupled to $V_{DD}$ in a manner to be described in greater detail below; in the center portion 302, bump 313 is to couple to an input and/or output signal; and in the right-hand portion 303, bumps 314 and 315 can be selectively coupled to $V_{SS}$. For illustrative purposes, each portion of IC 300 shown in FIG. 7 represents only a segment of an actual IC; however, it will be understood by those of ordinary skill in the art that each portion can comprise many more power, I/O, and/or ground bumps.

In all three portions 301–303 of IC 300, a polyimide layer 320 overlies a silicon nitride layer 322. The layers 320 and 322 of polyimide and silicon nitride, respectively, have been removed in the vicinity of bumps 312–314, so that bumps 312–314 make physical and electrical contact with corresponding terminals 333, 352, and 361. Layers 320 and 322 are not removed under bumps 311 or 315, because they serve as dielectric layers for the decoupling capacitors 304 and 306, respectively.

Figure 7:
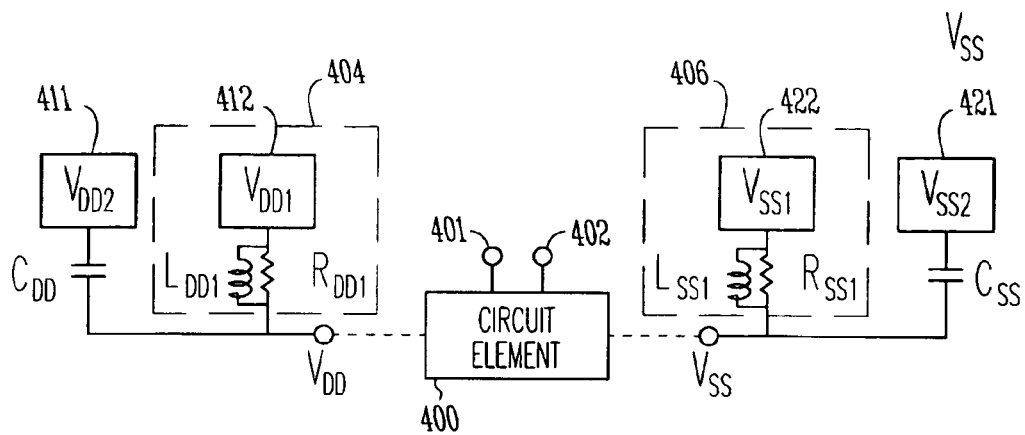
FIG. 7 illustrates an electrical representation of three portions of an IC, having respective power, I/O, and ground terminals, and further having selectable decoupling capacitors, according to one embodiment of the invention.

FIG. 7 illustrates an electrical representation of three portions of IC 300 shown in FIG. 6, having respective power, I/O, and ground terminals. Also illustrated in FIG. 7 are selectable decoupling capacitors $C_{DD}$ and $C_{SS}$, according to one embodiment of the invention.

A power ($V_{DD1}$) terminal 412 on the left-hand side of FIG. 7 corresponds to $V_{DD1}$ bump 312 in FIG. 6. When operated at a high AC frequency, $V_{DD1}$ bump 312 in FIG. 6 functions as an equivalent resistive-inductive circuit, represented within dashed lines in FIG. 7 as circuit 404. Under this condition, circuit 404 comprises an equivalent inductor $L_{DD1}$ and resistor $R_{DD1}$ coupled in parallel to $V_{DD1}$.

Similarly, a ground ($V_{SS1}$) terminal 422 on the right-hand side of FIG. 7 corresponds to $V_{SS1}$ bump 314 in FIG. 6. When operated at a high AC frequency, $V_{SS1}$ bump 314 in FIG. 6 functions as an equivalent resistive-inductive circuit, represented within dashed lines in FIG. 7 as circuit 406. Under this condition, circuit 406 comprises an equivalent inductor $L_{SS1}$ and resistor $R_{SS1}$ coupled in parallel to $V_{SS1}$.

Circuit element 400 in the center portion of FIG. 7 is a block diagram electrical representation of the center portion 302 of FIG. 6. Circuit element 400 can comprise one or more input and/or output nodes or terminals, such as I/O terminals 401 and 402.

As will be described in greater detail below regarding FIGS. 12 and 13, any combination of terminals 411, 412, 421, and 422 can be selectably coupled to circuit element 400, in order to adjust the operational characteristic(s), such as the resistive-capacitance (RC) characteristic, of circuit element 400.

Figure 8:
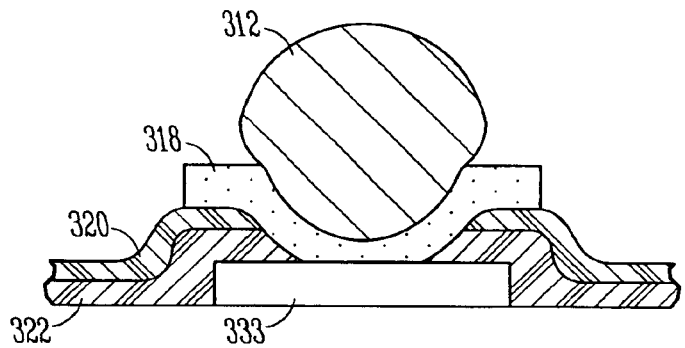
FIG. 8 illustrates in greater detail the resistive-inductive terminal 333 shown in FIG. 6.

FIG. 8 illustrates in greater detail the resistive-inductive terminal 333 shown in FIG. 6. Solder bump 312 is coupled to conductive terminal 333 by way of an adhesion layer 318. Adhesion layer 318 can comprise any suitable material or combination of materials known to those of ordinary skill in the art, such as solder, solder flux, a barrier layer, and so forth. Layers 320 and 322 of polyimide and silicon nitride, respectively, are removed in the vicinity of bump 312, so that bump 312 can make physical and electrical contact with terminal 333. In one embodiment, polyimide layer 320 has a dielectric constant of approximately 3, and silicon nitride layer 322 has a dielectric constant of approximately 7; however, other dielectrics having dielectric constants different from those mentioned above can also be used with embodiments of the present invention. For example, layer 320 could be silicon dioxide.

Figure 9:
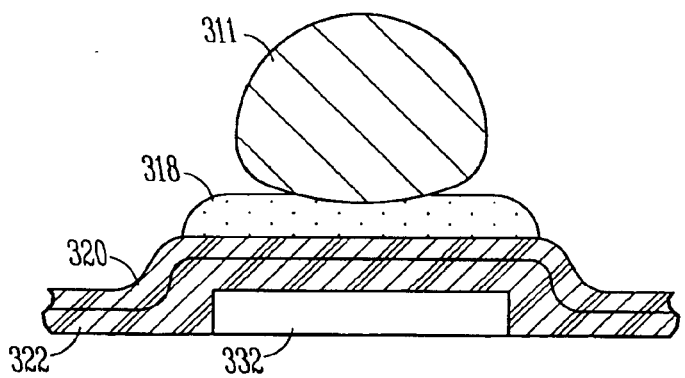
FIG. 9 illustrates in greater detail the capacitive terminal 332 shown in FIG. 6.

FIG. 9 illustrates in greater detail the capacitive terminal 332 shown in FIG. 6. Solder bump 311 is coupled to the upper dielectric layer 320 by way of adhesion layer 318. Adhesion layer 318 can be similar to or identical to that described above regarding FIG. 8. As shown in FIG. 9, layers 320 and 322 are not removed in the vicinity of bump 311, but rather layers 320 and 322 overlie conductive terminal 332.

In one embodiment, layers 320 and 322 are low permittivity layers. The expression "low permittivity layer" as used herein means a layer of low permittivity material such as glass, quartz, ceramic, polyimide, silicon dioxide, silicon nitride, silicon oxynitride, or the like.

In one embodiment, layer 320 is polyimide having a dielectric constant of approximately 3, and layer 322 is silicon nitride having a dielectric constant of approximately 7; however, other dielectrics having dielectric constants different from those mentioned above can also be used with embodiments of the present invention. For example, layer 320 could be silicon dioxide having a dielectric constant of approximately 5.

Alternatively, either or both layer 320 and layer 322 could comprise a composite layer that includes a layer of silicon dioxide and a layer of silicon nitride, or a sandwich layer that includes several alternating layers of silicon dioxide and silicon nitride. The thicknesses of these layers can be varied in order to alter the capacitance value.

Alternatively, layers 320 and 322 are high permittivity layers. The expression "high permittivity layer" as used herein means a layer of high permittivity material such as a high permittivity ceramic ply such as titanate particles; a high permittivity dielectric film such as a titanate film (e.g. $(Ba_xSr_{1-x})TiO_3$ (BST) or $PbZrTiO_3$ (PZT) or $Ta_2O_5$ or $SrTiO_3$) that is deposited, for example, by Sol-Gel or metal-organic chemical vapor deposition (MOCVD) techniques; or a layer of any other type of high permittivity material such as, but not limited to, $SrBi_2Ta_2O_9$ (SBT), $(Pb,La)(Zr,Ti)O_3$, and $Bi_4Ti_3O_{12}$.

In one embodiment, capacitance values for individual capacitors, and/or groups of capacitors, can be varied throughout the IC or any part of the IC. Fabricating capacitors with different capacitance values can be achieved in any suitable manner. For example, different capacitance values can be accomplished by using different thicknesses or structures of dielectric or by using dielectric materials having different permittivity values.

Figure 10:
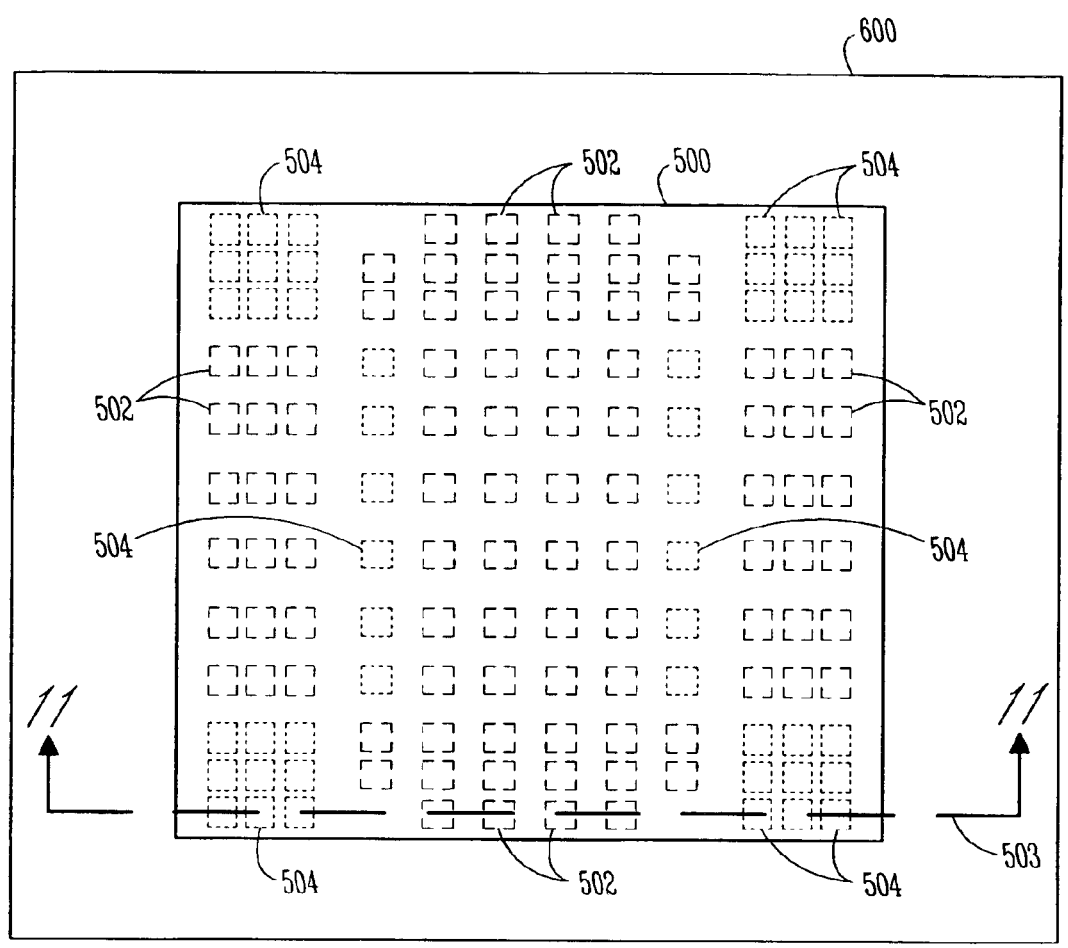
FIG. 10 illustrates a top-view of an IC on a substrate in an electronic assembly, according to one embodiment of the invention.

FIG. 10 illustrates a top-view of an IC 500 on a substrate 600 in an electronic assembly, according to one embodiment of the invention. IC 500 and substrate 600 can be similar to IC 50 and substrate 60, respectively, as illustrated in the prior art electronic assembly shown in FIG. 2. IC 500 can be of any type. Substrate 600 can be of any type, and it can comprise a single layer or multiple layers. Substrate 600 can be of any composition, such as ceramic or organic material. IC 500 can be mounted to substrate 600 in any way. In one embodiment, IC 500 is mounted to substrate 600 using a "controlled collapse chip connect" (C4) process. In fabricating a C4 package, the electrically conductive terminals of an IC component are soldered directly to corresponding pads on the surface of the substrate using reflowable solder bumps or balls. The C4 process is widely used because of its robustness and simplicity; however, embodiments of the present invention should not be construed as limited to ICs that are mounted using a C4 process, and any other suitable process can be used.

IC 500 comprises a plurality of power, ground, and signal conductors (not shown) that terminate in terminals 502 arranged on the bottom surface of IC 500. Terminals 502 can be coupled to corresponding pads or signal nodes (not shown) on substrate 600 by appropriate connections such as solder bumps or solder balls (506, FIG. 11). Terminals 502 are non-floating terminals.

In FIG. 10 we are looking through the upper surface of IC 500 at terminals 502 (shown in dashed lines) on the bottom surface of IC 500. Individual terminals 502 represent power, ground, or signal nodes.

To implement the selectable decoupling capacitors of embodiments of the present invention, additional terminals 504 are provided on the bottom surface of IC 500. In FIG. 10, terminals 504 are shown in a distinctive dashed outline to distinguish them visually from terminals 502. One or more terminals 504 can be added to IC 500 wherever they can be fitted into the layout among terminals 502 or among other physical structure on the bottom surface of IC 500. Terminals 504 are floating terminals.

Figure 12:
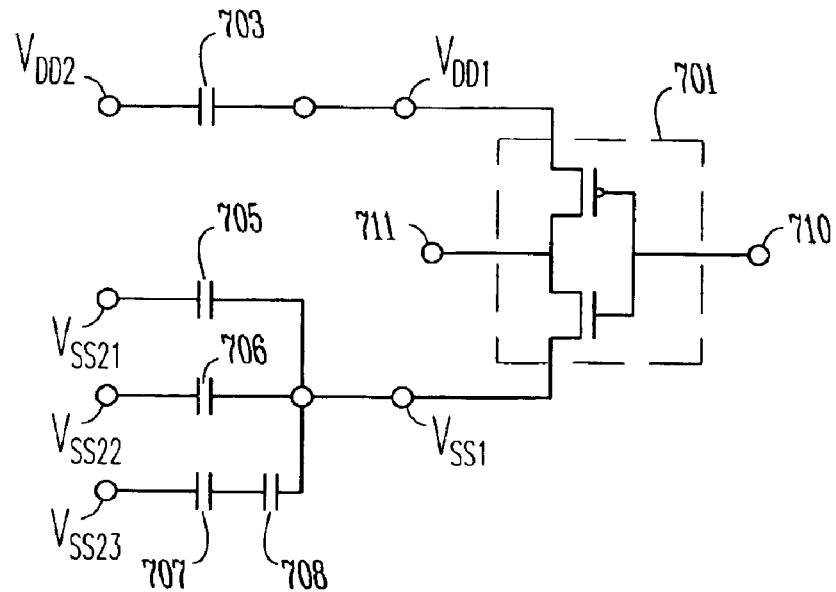
FIG. 12 illustrates floating and non-floating terminals coupled to a representative circuit element in the form of an inverter, according to one embodiment of the invention.
Figure 13:
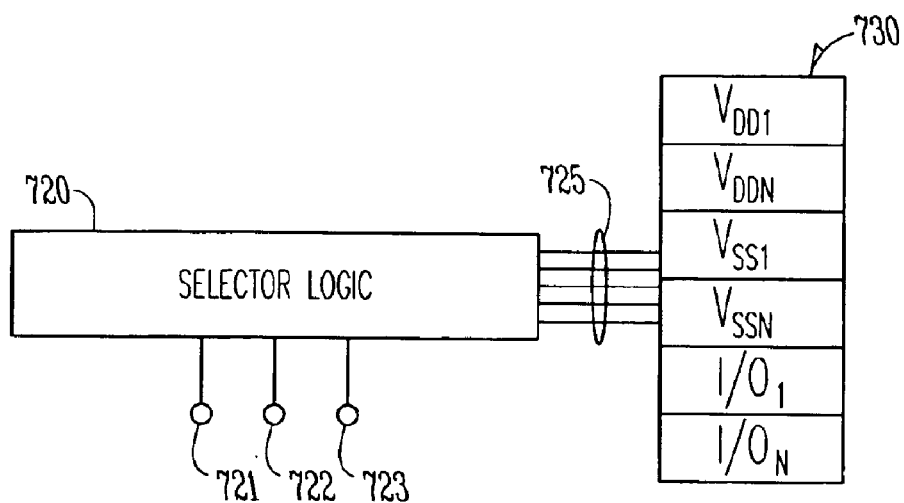
FIG. 13 illustrates selector logic, according to one embodiment of the invention.

As is described regarding FIGS. 12 and 13, various combinations of floating terminals 504 and non-floating terminals 502 can be selectively coupled to a node of a circuit element to adjust the operational characteristics of the circuit element. In one embodiment, one or more floating terminals 504 are grouped with a non-floating terminal 502. In designing the layout of IC 500 to accommodate floating terminals 504, floating terminals 504 can be located wherever there is sufficient space on the surface of IC 500, and they do not necessarily have to be located adjacent the non-floating terminal 502 with which they are logically grouped.

Figure 11:
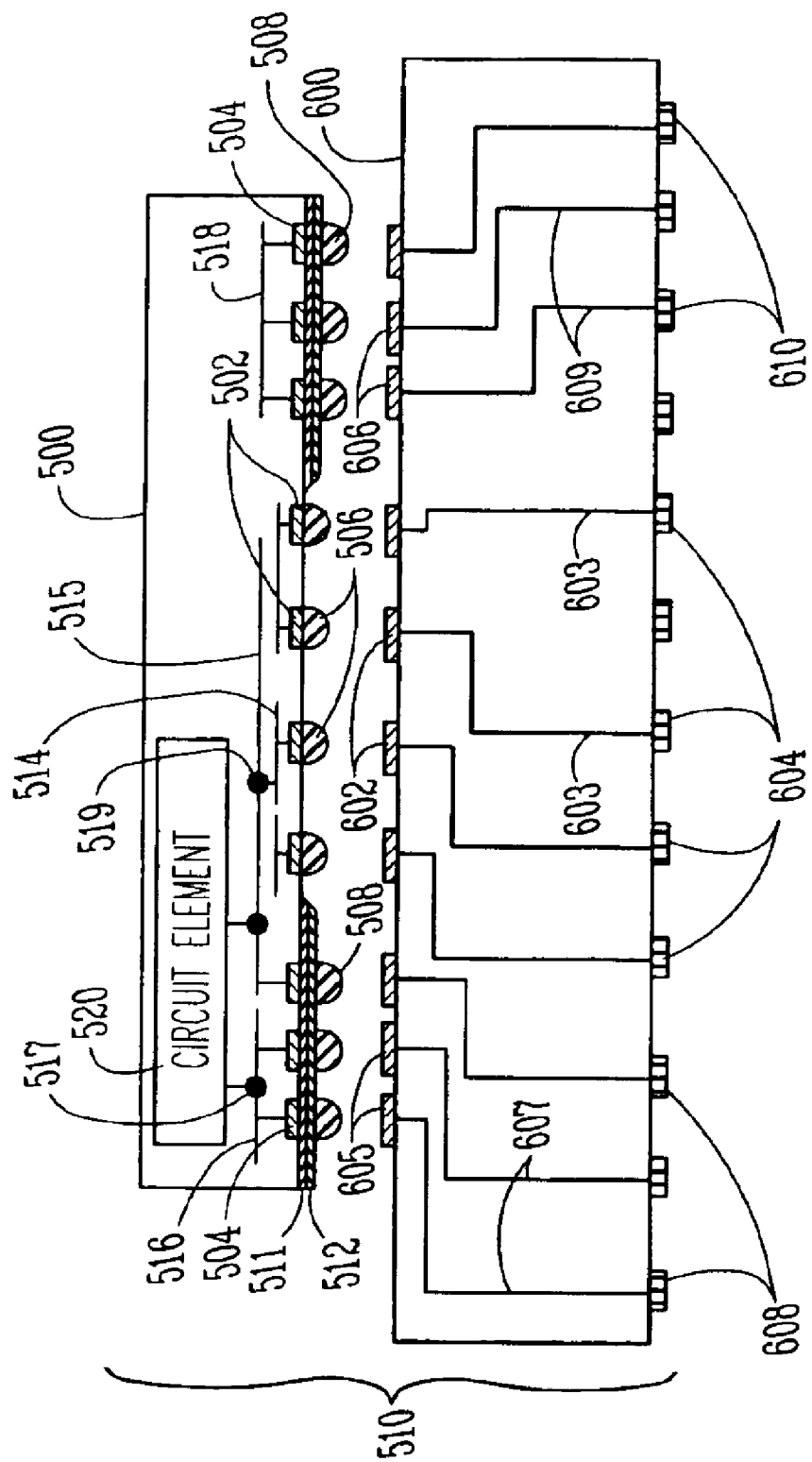
FIG. 11 illustrates a cross-sectional view of the electronics assembly shown in FIG. 10 taken along line 503 of FIG. 10.

FIG. 11 illustrates a cross-sectional view of the electronics assembly shown in FIG. 10 taken along line 503 of FIG. 10. The electronics assembly 510 illustrated in FIG. 11 comprises IC 500 and substrate 600.

IC 500 comprises at least one circuit element 520. Although only one circuit element 520 is illustrated, IC 500 can have many circuit elements 520. Circuit element 520 can be of any type, such as, for example, a digital logic circuit, an analog circuit, a power circuit, sense circuit, amplifier circuit, radio circuit, or the like.

IC 500 further comprises a plurality of non-floating terminals 502 and a plurality of floating terminals 504 on the surface of IC 500 that is to be coupled to substrate 600. Each non-floating terminal 502 has a bump 506 coupled to it. At least one non-floating terminal 502 is coupled to a node 519 by way of a conductor or trace 514. Node 519 is in turn coupled to circuit element 520 by way of a trace 515.

Non-floating terminals 502 of IC 500 can be coupled to corresponding pads 602 on the upper surface of substrate 600. Pads 602 are in turn coupled to internal traces or circuit paths within substrate 600, such as circuit paths 603. One or more circuit paths 603 can be coupled to terminals or lands 604 on the bottom surface of substrate 600. Substrate 600 can be of any type, including a single layer or multi-layer substrate. Substrate 600 need not necessarily have any lands, such as lands 604, 608, or 610, on its bottom surface, but in one embodiment it does have such lands.

On the left-hand and right-hand sides of IC 500 are depicted a number of floating terminals 504. As shown on the left-hand side of IC 500, floating terminals 504 are physically and electrically separated from bumps 508 by two dielectric layers 511 and 512. In one embodiment, layer 511 comprises silicon nitride, and layer 512 comprises polyimide. A floating terminal is shown in greater detail in FIG. 9, described above. Although the bumps 508 that are coupled to floating terminals 504 are depicted in FIG. 11 as extending substantially further from the lower surface of IC 500 than corresponding bumps 506 that are coupled to non-floating terminals 502, the illustration is not to scale, and the dielectric layers 511 and 512 are in actuality very thin, so that all of the bumps 502 and 504 are very nearly co-planar.

Still referring to the floating terminals 504 on the left-hand side of IC 500, at least one of the floating terminals 504 is coupled to a trace 516, which in turn is coupled to a node 517. Node 517 is coupled to circuit element 520. On the right-hand side of IC 500, at least one floating terminal 504 is coupled to a trace 518, which in turn can be coupled to a node (not shown) that is in turn coupled to a circuit element (not shown). While various of the floating terminals 504 and/or non-floating terminals 502 are depicted as being coupled together by internal traces, such as trace 516 or trace 518, it will be understood by those of ordinary skill in the art that the manner in which the floating and non-floating terminals are coupled to internal traces is dependent upon the particular design parameters and requirements of IC 500.

Substrate 500, in addition to having pads 602 to which bumps 506 can be mounted as described above, further comprises pads 605 to which bumps 508 on the left-hand side of IC 500 can be mounted, and it further comprises pads 606 to which bumps 508 on the right-hand side of IC 500 can be mounted. Pads 605 are in turn coupled to internal traces or circuit paths within substrate 600, such as circuit paths 607. One or more circuit paths 607 can be coupled to lands 608 on the bottom surface of substrate 600. Similarly, pads 606 are in turn coupled to internal traces or circuit paths within substrate 600, such as traces 609. One or more circuit paths 609 can be coupled to lands 610 on the bottom surface of substrate 600.

The addition of floating terminals to an IC design, such as that of IC 500, generally requires a corresponding substrate design, such as that of substrate 600, so that added floating terminals have corresponding pads and circuit paths to which the floating terminals are physically and electrically coupled.

FIG. 12 illustrates floating and non-floating terminals coupled to a representative circuit element in the form of an inverter 701, according to one embodiment of the invention. Inverter 701 is merely representative of a circuit element, and any other type of circuit element could be substituted for inverter 701.

Inverter 701 comprises an input terminal 710 and an output terminal 711. Inverter 701 also comprises a pair of supply terminals, in the form of a drain terminal $V_{DD1}$ and a source terminal $V_{SS1}$. Drain terminal $V_{DD1}$ and source terminal $V_{SS1}$ are non-floating terminals.

Coupled to drain terminal $V_{DD1}$ is a decoupling capacitor 703. Capacitor 703 is also coupled to drain terminal $V_{DD2}$. Drain terminal $V_{DD2}$ is a floating terminal. While just one capacitor 703 is illustrated, more than one capacitor could be used.

Coupled to source terminal $V_{SS1}$ are three decoupling capacitors 705, 706, and 708. Capacitors 705–706 are also coupled to source terminals $V_{SS21}$-$V_{SS22}$, respectively. Capacitors 707 and 708 are coupled in series, and capacitor 707 is coupled to source terminal $V_{SS23}$. Source terminals $V_{SS21}$-$V_{SS23}$ are floating terminals. While four capacitors 705–708 are illustrated, fewer or more capacitors could be used. Providing several capacitors enables a corresponding number of capacitance levels to be selectively switched in, thus providing more versatility in adjusting the operational characteristic(s) (e.g. an RC characteristic) of a circuit element in IC 500 than if only one capacitor were provided.

Through the use of selector logic 720 (FIG. 13), any desired combination of floating and non-floating terminals can be coupled to inverter 701. For example, floating terminal $V_{DD2}$ could alone be coupled to inverter 701. Or non-floating terminal $V_{DD1}$ could alone be coupled to inverter 701. Or both terminals $V_{DD1}$ and $V_{DD2}$ could be coupled to inverter 701. Similarly, regarding the source side of inverter 701, any combination of capacitors 705, 706, and/or the capacitor pair 707–708 can be coupled, either alone or in conjunction with terminal $V_{SS1}$, to inverter 701; alternatively, terminal $V_{SS1}$ alone can be coupled to inverter 701.

In FIG. 12, capacitors 703 and 705–708 can be fabricated with identical or different capacitance values, or with any combination of capacitance values, using the techniques for varying the capacitance value mentioned above regarding FIG. 9. In this manner, a variety of possible capacitance values can be provided, and these can be selectively switched in to adjust the operational characteristic(s) of a circuit element across a spectrum of possible values, thereby increasing the probability for success in optimizing the performance of the circuit element.

FIG. 13 illustrates selector logic 720, according to one embodiment of the invention. Selector logic 720 is used to selectively couple any desired combination of floating and non-floating terminals to one or more circuit elements to adjust their operational characteristic(s).

The selector logic includes a plurality of inputs, various internal logic elements, and a plurality of outputs that are distributed within the IC and that couple to the floating terminals as well as to at least some of the non-floating terminals.

In one embodiment, selector logic 720 comprises three inputs 721–723, although it will be understood by those of ordinary skill in the art that fewer or more inputs can be used. Selector logic 720 comprises a plurality of output lines 725, whose number can also be suitably varied to accommodate a desired number of floating and non-floating terminals.

Signals output over output lines 725 are used to connect floating and/or non-floating terminals within portion 730 of IC 500 to one or more appropriate circuit elements of IC 500. By way of example, a first output signal or signal combination can couple non-floating terminal $V_{DD1}$ to inverter 701 (FIG. 12). Another output signal can couple any one or more floating terminals $V_{DDN}$, such as terminal $V_{DD2}$, to inverter 701. Another output signal can couple non-floating terminal $V_{SS1}$ to inverter 701. Other output signals can couple any one or more floating terminals $V_{SSN}$, such as $V_{SS21}$, $V_{SS22}$, or $V_{SS23}$, to inverter 701.

Although I/O terminals are not illustrated in FIG. 12 as being coupled to the input 710 or output 711 of inverter 701, one or more floating I/O terminals can also be coupled to a circuit element, such as inverter 701. For example, selector logic 720 can generate an output signal or signal combination to couple any one or more non-floating terminals, such as $I/O_1$, to a circuit element. Likewise, an output signal can couple any one or more floating terminals, such as $I/O_N$, to a circuit element.

Figure 14:
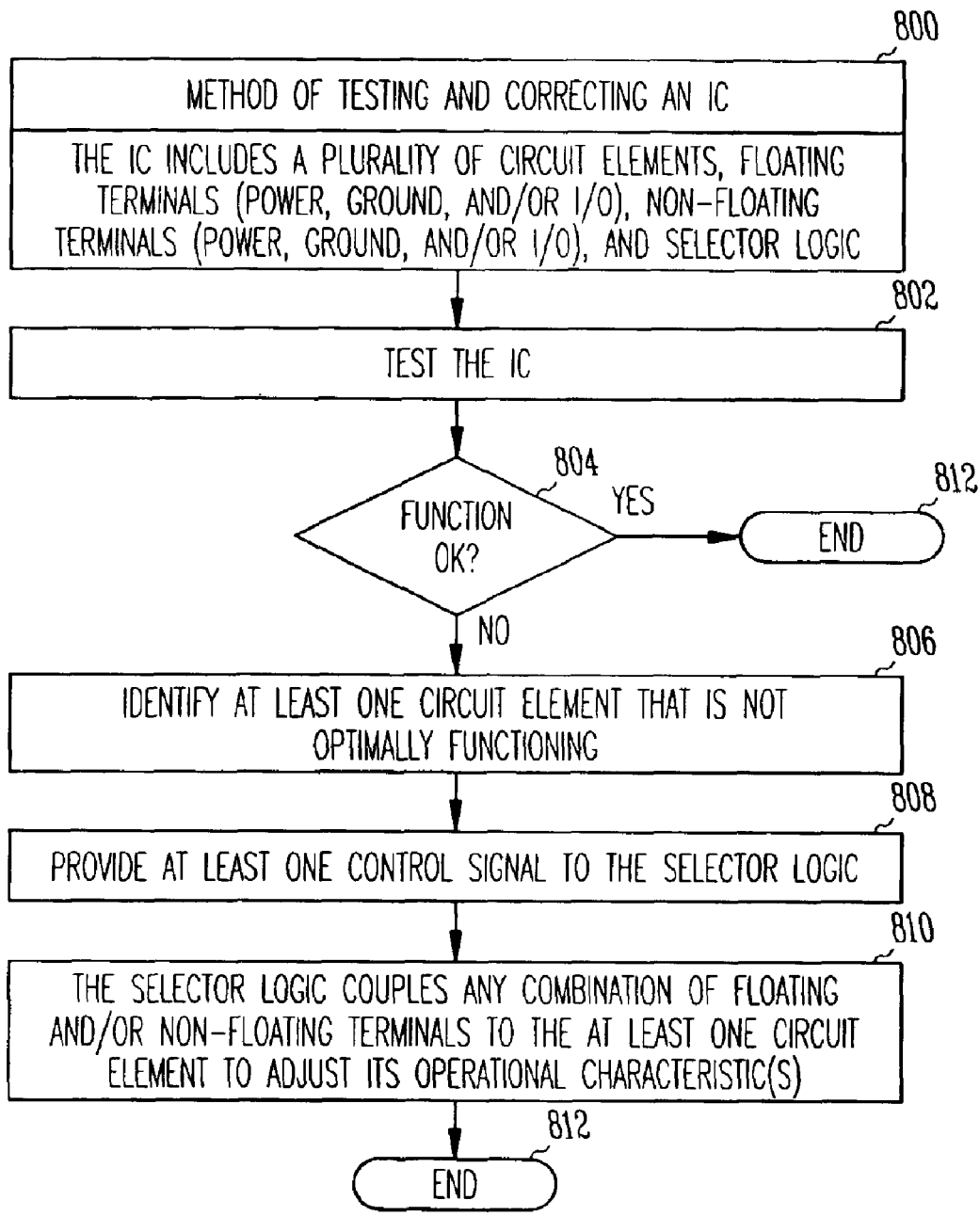
FIG. 14 illustrates a flow diagram of a method of testing and correcting an IC, according to one embodiment of the invention.

FIG. 14 illustrates a flow diagram of a method 800 of testing and correcting an IC, according to one embodiment of the invention. The IC includes a plurality of circuit elements. The IC also includes a plurality of non-floating terminals whose function is to conduct power, ground, or input and/or output values. The IC also includes a plurality of floating terminals, one or more of which can be optionally provided for any of the non-floating terminals. In addition, the IC also includes selector logic, such as that described earlier with reference to FIG. 13.

In 802, the IC is tested. As an example, the IC can be tested as part of a die-level test process, either before or after being separated from the wafer, or after packaging. The testing can be conducted using any type of test equipment, including automated test equipment, manual test equipment, or the like.

In decision box 804, a determination is made whether all IC functions are OK; if so, the method ends at 812, but if not, it proceeds to 806. The determination in box 804 can be made according to any desired criteria, such as device specifications, device tolerances, or the like.

In 806, at least one circuit element is identified that is not optimally functioning, or that is totally non-functional. For example, one or more speedpaths or escapes may be identified for individual circuit elements. As other examples, a power, ground, or I/O line may be noisy and require the circuit characteristic(s) of its associated circuit element(s) to be modified. Assuming that the at least one circuit element that has been identified as not optimally functioning has at least one selectable decoupling capacitor that can be used to modify the operational characteristic(s) of the circuit element, the method proceeds to 808; otherwise, it terminates, because the sub-optimal operation of the circuit element cannot be modified.

In 808, at least one control signal is provided to the selector logic. Depending upon the design of the selector logic, a single control signal or a combination of control signals can be used for each circuit element that is identified as not optimally functioning. In one embodiment, the control signal(s) are generated externally to the IC and are applied to corresponding control inputs of the IC.

In 810, the selector logic, in response to the at least one control signal, couples any combination of floating and/or non-floating terminals to the at least one circuit element to adjust its operational characteristic(s). As described above with reference to FIG. 12, many combinations of floating and/or non-floating terminals are possible. For example, one combination is to add no additional capacitance, and to couple only the original non-floating terminal(s) to the circuit element. Other combinations include pairing one floating terminal with a non-floating terminal; substituting one floating terminal for a non-floating terminal; pairing or substituting two or more floating terminals with a non-floating terminal; and so forth.

The method is flexible and can be suitably modified as necessary. As an example, decision box 804 could be performed for only one IC function or for only a subset of IC functions, and a loop could be carried out by looping back from any desired point to any other desired point. For example, the method could loop from 806 back to 802 or to 804. Alternatively, it could loop from 810 back to 802, 804, or 806.

In 812, the method ends.

Figure 15A:
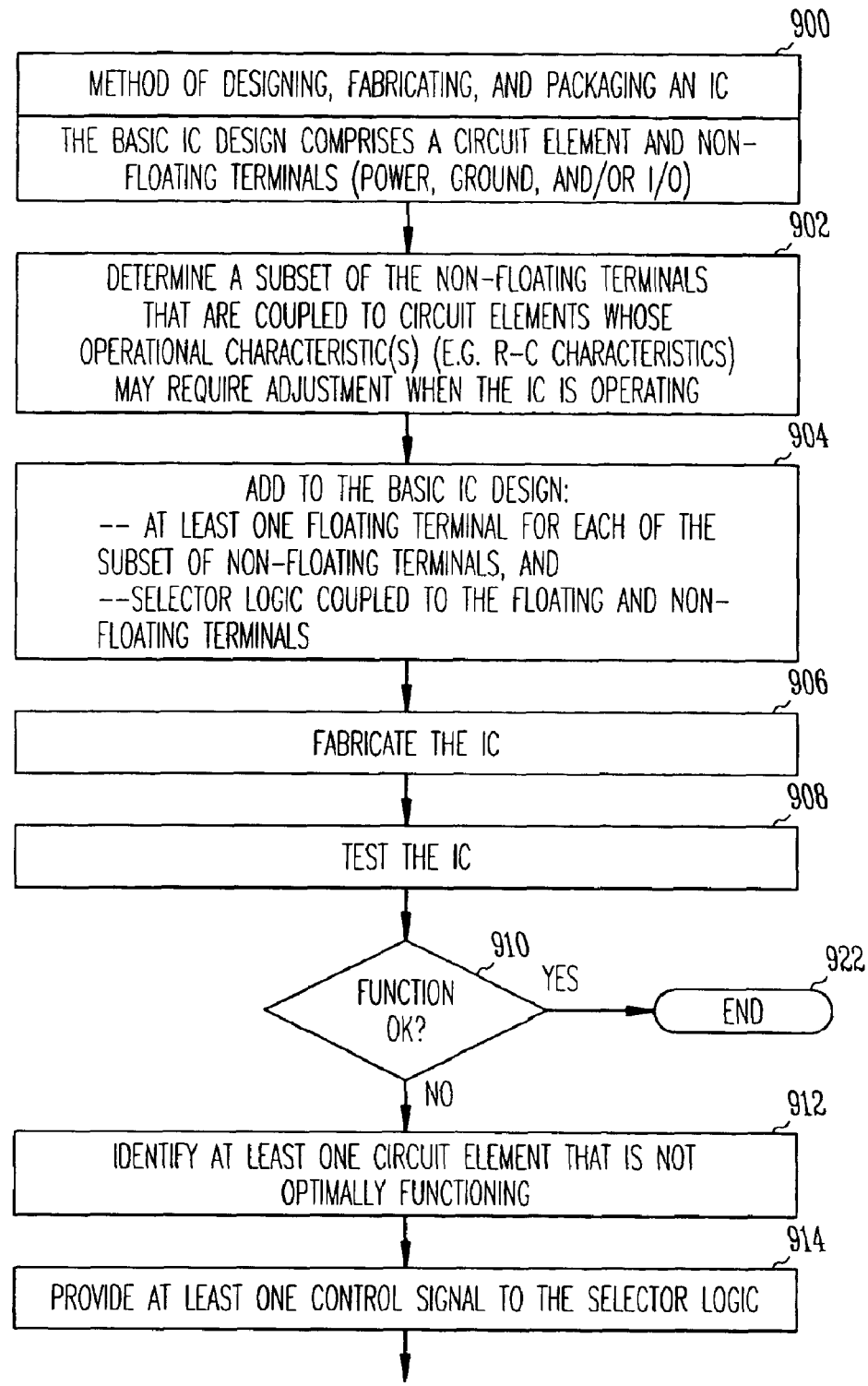
FIGS. 15A–15B together illustrate a flow diagram of a method of designing, fabricating, and packaging an IC, according to one embodiment of the invention.
Figure 15B:
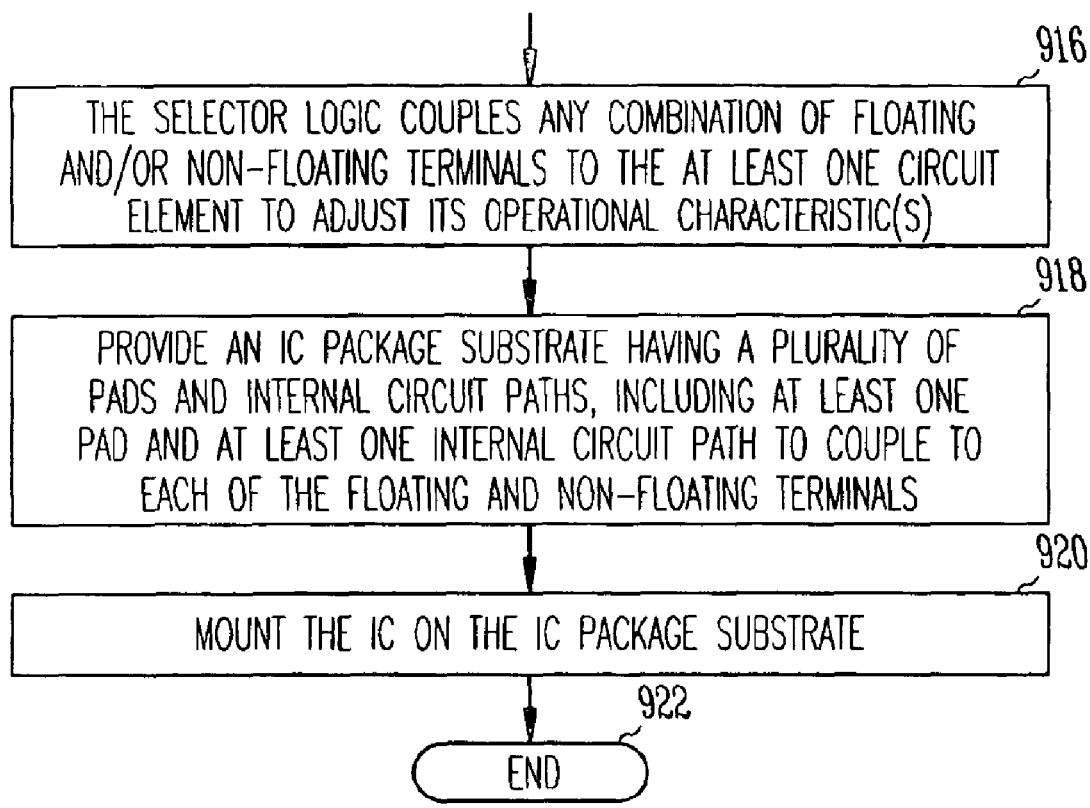

FIGS. 15A–15B together illustrate a flow diagram of a method 900 of designing, fabricating, and packaging an IC, according to one embodiment of the invention. The basic IC design includes at least one circuit element and one or more non-floating terminals to conduct power, ground, or input and/or output values.

In FIGS. 15A and 15B, the earlier descriptions regarding similar or identical boxes in FIG. 14 also apply.

In 902, a subset of non-floating terminals is determined, based upon the circuit designer's estimation of which circuit elements may have their operational characteristic(s) adversely affected by one or more factors. These factors can include process modifications, process enhancements, normal or abnormal process variations, mask changes including mask shrinks, design changes, operation of the IC at a different (e.g. higher) clock frequency or under other conditions that deviate from original specifications, and the like.

In 904, the IC designer adds the following to the existing, basic IC design: at least one floating terminal for each of the subset of non-floating terminals determined in 902, and selector logic. The selector logic includes a plurality of inputs, various internal logic elements, and a plurality of outputs that are distributed within the IC and that couple to the floating terminals as well as to at least some of the non-floating terminals. In one embodiment, selector logic outputs are coupled to some or all of the non-floating terminals that were identified in 902 of FIG. 15A.

The implementation of selector logic suitable for carrying out the purposes of the disclosure is dependent upon a number of factors, including the type and complexity of the IC, the anticipated number of potentially malfunctioning circuit elements, the average number of floating terminals per non-floating terminal, as well as other factors. The design of selector logic to implement the purpose and scope of the disclosure can be performed by those of ordinary skill in the art.

Regarding the size of the subset of floating terminals determined in 902 of FIG. 15A, it should be noted that in the most extreme case, the subset of non-floating terminals determined in 902 could include all of the ICs non-floating terminals, although such would not ordinarily be practicable due to limited silicon area for providing the floating terminals and associated selector logic per 904 of FIG. 15A. However, at current design levels, up to approximately 100 floating terminals can be provided for a very large scale integrated circuit.

It will be noted that although the selector logic outputs ordinarily couple to some or many of the non-floating terminals, they do not necessarily have to. If desired, the selector logic outputs could couple only to floating terminals. However, the ability to switchably connect any combination of floating and non-floating terminals is dependent upon selector logic outputs being coupled to at least some of the non-floating terminals.

In 906, the changes to the IC design are made according to any applicable design rules, and the IC is then fabricated according to any desired process and specifications.

Ordinarily the IC would be fabricated as part of a wafer of identical ICs.

In 908, the IC is tested. As discussed earlier, the IC can be tested using any suitable test equipment. The IC can be tested at any desired stage, either before or after the die is cut from the wafer. Any suitable test sampling method can be employed. For example, every IC can always be tested; alternatively, sample ICs from each wafer can be tested; or ICs from first production can be tested and none thereafter. Other test sampling methods are also possible.

In decision box 910, a determination is made whether all IC functions are OK; if so the method ends at 922, but if not, it proceeds to 912.

In 912, at least one circuit element is identified that is not optimally functioning, or that is totally non-functional.

In 914, at least one control signal is provided to the selector logic.

In 916, the selector logic, in response to the at least one control signal, couples any combination of floating and/or non-floating terminals to the at least one circuit element to adjust the operational characteristic(s) of the at least one circuit element.

In 918, an IC package substrate is provided. The substrate comprises a plurality of pads and internal circuit paths, including at least one pad and at least one internal circuit path to couple to each of the floating and non-floating terminals of the IC.

In 920, the IC is mounted on the IC package substrate. Mounting the IC includes, for example, registering the IC terminals with corresponding pads of the substrate, and then heating the package to cause the solder bumps on the IC terminals to become physically and electrically connected to the substrate pads.

In 922, the method ends.

The operations described above with respect to the methods illustrated in FIGS. 14, 15A, and 15B can be performed in a different order from those described herein.

The present disclosure provides for apparatus and methods that integrate selectable decoupling capacitors into the design, fabrication, test, correction, and packaging of integrated circuits. In one embodiment, selectable capacitors are incorporated into an IC as additional or alternative mounting terminals on a surface of the IC, particularly for circuit elements whose operational characteristic(s) is predicted as possibly being sub-optimal under normal operation, or as possibly becoming sub-optimal as a result of a process change, design change, mask shrink, operation of the IC at higher clock frequency or under other conditions that deviate from original specifications, or the like.

Expensive redesign of the IC is avoided by selectively coupling capacitors into the IC circuit element as needed, under control of selector logic that is responsive to suitable control signals. The selector logic can switchably couple any combination of existing and additional mounting terminals to a node of the circuit element to change the operational characteristic(s) of the circuit element, so that it functions within desired parameters.

As shown herein, the present disclosure can be implemented in a number of different embodiments, including an integrated circuit package, an electronic assembly, an electronic system, a data processing system, a method of testing and correcting an IC, and a method of designing, fabricating, and packaging an IC. Other embodiments will be readily apparent to those of ordinary skill in the art. The elements, architecture, dimensions, and sequence of operations can all be varied to suit particular product and test requirements.

For example, although the decoupling capacitors are illustrated as capacitive elements substantially at a surface of an IC, they could alternatively be located deeper inside an IC.

The various elements depicted in the drawings are merely representational and are not drawn to scale. Certain proportions thereof may be exaggerated, while others may be minimized. The drawings are intended to illustrate various implementations of the inventive subject matter, which can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present disclosure. Therefore, it is manifestly intended that embodiments of this invention be limited only by the claims and the equivalents thereof.

What is claimed is:

1. An integrated circuit comprising:
   at least one circuit element;
   a node coupled to the at least one circuit element;
   at least one non-floating terminal on a surface of the integrated circuit to mount to a corresponding pad on a substrate, wherein the at least one non-floating terminal comprises a first solder bump and a first conductor;
   at least one floating terminal on the surface of the integrated circuit to mount to a corresponding pad on the substrate, wherein the at least one floating terminal comprises a second solder bump, a second conductor, and at least one dielectric layer physically separating and in physical contact with the second solder bump and the second conductor; and
   at least one coupling element to couple any combination of the at least one floating terminal and the at least one non-floating terminal to the node.

2. The integrated circuit recited in claim 1 wherein the node is selected from the group consisting of power nodes, ground nodes, and input/output nodes.

3. The integrated circuit recited in claim 1 wherein the second solder bump, second conductor, and at least one dielectric layer of the at least one floating terminal form a capacitive element.

4. The integrated circuit recited in claim 3 wherein the first conductor and the second conductor can be selectively coupled to the node.

5. The integrated circuit recited in claim 4 wherein the substrate pad is selected from the group consisting of a power terminal, a ground terminal, and an input/output terminal.

6. The integrated circuit recited in claim 1 wherein the at least one coupling element comprises selector logic coupled to the at least one floating terminal, to the at least one non-floating terminal, and to the node, and comprising at least one control input, at least one logic element coupled to the at least one control input, and at least one output to couple any combination of the first and second conductors to the node.

7. The integrated circuit recited in claim 1 wherein the at least one circuit element is selected from the group consisting of a digital logic circuit, an analog circuit, a power circuit, a sense circuit, an amplifier circuit, and a radio circuit.

8. The integrated circuit recited in claim 1 wherein the at least one circuit element comprises an inverter circuit.

9. An integrated circuit comprising:
   a plurality of circuit elements;
   a plurality of nodes coupled to the plurality of circuit elements;
   a plurality of non-floating terminals on a surface of the integrated circuit;
   at least one floating terminal on the surface of the integrated circuit; and
   selector logic coupled to the terminals and to the plurality of nodes to couple any combination of the at least one floating terminal and one of the plurality of non-floating terminals to one of the plurality of nodes.

10. The integrated circuit recited in claim 9 wherein the one node is selected from the group consisting of power nodes, ground nodes, and input/output nodes.

11. The integrated circuit recited in claim 9 wherein the at least one floating terminal comprises a capacitive element.

12. The integrated circuit recited in claim 11 wherein the capacitive element comprises a connector element, at least one dielectric layer, and a conductor that can be selectively coupled to the one node.

13. The integrated circuit recited in claim 12 the connector element comprises a solder bump.

14. The integrated circuit recited in claim 9 wherein the selector logic comprises at least one control input and further comprises at least one output to selectively couple any combination of the at least one floating terminal and one of the plurality of non-floating terminals to the one node.

15. An electronic assembly comprising:
   an integrated circuit having
      at least one circuit element;
      a node coupled to the at least one circuit element;
      at least one floating terminal on the surface of the integrated circuit to mount to a corresponding pad on a substrate, wherein the at least one floating terminal comprises a solder bump, a conductor, and at least one dielectric layer physically separating and in physical contact with the solder bump and the conductor; and
      at least one coupling element to switchably couple the at least one floating terminal to the node; and
   an integrated circuit package substrate comprising a plurality of pads and internal circuit paths, including at least one pad and at least one internal circuit path to couple to the at least one floating terminal.

16. The electronic assembly recited in claim 15 wherein the solder bump, conductor, and at least one dielectric layer form a capacitive element.

17. The electronic assembly recited in claim 15 wherein the at least one coupling element comprises selector logic coupled to the at least one floating terminal and to the node, and comprising at least one control input, at least one logic element coupled to the at least one control input, and at least one output to couple the conductor of the at least one floating terminal to the node.

* * * * *